United States Patent
Kim et al.

(10) Patent No.: US 8,474,135 B2
(45) Date of Patent: Jul. 2, 2013

(54) METHOD FOR FABRICATING PRINTED CIRCUIT BOARD

(75) Inventors: Ki-Hyun Kim, Suwon-si (KR); Se Ho Park, Suwon-Si (KR); Seok-Myong Kang, Hwaseong-si (KR); Young-Min Lee, Yongin-si (KR)

(73) Assignee: Samsung Electronics Co., Ltd (KR)

( * ) Notice: Subject to any disclaimer, the term of this patent is extended or adjusted under 35 U.S.C. 154(b) by 1018 days.

(21) Appl. No.: 12/504,339

(22) Filed: Jul. 16, 2009

(65) Prior Publication Data
US 2010/0011573 A1    Jan. 21, 2010

(30) Foreign Application Priority Data
Jul. 16, 2008 (KR) .................. 10-2008-0069096

(51) Int. Cl.
*H01K 3/10* (2006.01)
(52) U.S. Cl.
USPC ................................ 29/852; 29/846; 174/262
(58) Field of Classification Search
USPC .. 29/846, 851, 852; 174/257, 262; 361/321.4, 361/778; 427/97.2, 98.3
See application file for complete search history.

(56) References Cited

U.S. PATENT DOCUMENTS

| 4,567,542 | A | * | 1/1986 | Shimada et al. | ........... 361/321.4 |
| 5,601,672 | A | * | 2/1997 | Casey et al. | ..................... 29/851 |
| 6,096,411 | A |   | 8/2000 | Nakatani et al. | |
| 6,337,037 | B1 | * | 1/2002 | St. John | ..................... 252/520.3 |
| 6,889,432 | B2 |   | 5/2005 | Naito et al. | |

FOREIGN PATENT DOCUMENTS

| GB | 2 163 907 | 3/1986 |
| JP | 55-12777 | 1/1980 |
| JP | 62-67898 | 3/1987 |
| JP | 7-249866 | 9/1995 |
| JP | 8-316600 | 11/1996 |
| JP | 9-260801 | 10/1997 |
| JP | 2000-200951 | 7/2000 |
| JP | 2001-135903 | 5/2001 |
| JP | 2003-234572 | 8/2003 |
| JP | 2008-066444 | 3/2008 |

* cited by examiner

*Primary Examiner* — Donghai D. Nguyen
(74) *Attorney, Agent, or Firm* — The Farrell Law Firm, P.C.

(57) ABSTRACT

A method for fabricating a printed circuit board is provided. The method includes manufacturing a base film including a first side and a second side opposite to the first side; printing a first wiring on the first side with a high-viscosity conductive material having a viscosity of 5,000 to 300,000 centipoise (CPS); forming a via-hole that passes through both sides of the base film, and passes by the first wiring; and printing a second wiring on the second side with a low-viscosity conductive material having a viscosity of 100 to 5,000 CPS. The low-viscosity conductive material is applied to an inner wall of the via-hole to conductively connect the first wiring to the second wiring.

7 Claims, 5 Drawing Sheets

METHOD FOR FABRICATING PRINTED CIRCUIT BOARD

PRIORITY

This application claims priority under 35 U.S.C. §119(a) to a Korean Patent Application filed in the Korean Intellectual Property Office on Jul. 16, 2008 and assigned Serial No. 10-2008-0069096, the entire disclosure of which is incorporated herein by reference.

BACKGROUND OF THE INVENTION

1. Field of the Invention

The present invention relates generally to a printed circuit board, and more particularly, to a method for fabricating a printed circuit board for which wirings of printed circuit patterns are printed on both sides of the board, and connected to each other.

2. Description of the Related Art

Currently, small electronic devices requiring portability, such as a portable terminal and a portable video game, are increasing in popularity and electric home appliances are decreasing in size. However, these devices also are providing cutting-edge functions, thus causing a sharp increase in integration of their electronic parts.

In these types of small electronic devices, i.e., those that need wiring work in a small space, flexible printed circuit boards made of polyimide resin are often used, because the flexible printed circuit boards can be easily reduced in thickness and freely transformed into various forms. Further, the polyimide resin is superior in thermal resistance and electrical insulating properties.

FIG. 1 is a cross-sectional view illustrating a flexible printed circuit board found in the prior art.

Referring to FIG. 1, a conventional printed circuit board 10 has wirings 13 formed on both sides of a base film 11, and the wirings 13 are conductively connected to each other through via-holes 15 as occasion arises. In addition, cover layers 17 are formed on the wirings 13 using, for example, adhesives 19, to protect the wirings 13 formed on both sides of the base film 11.

On the conventional printed circuit board 10, copper foils forming the wirings 13 are stacked on one or both sides of the base film 11, and after the stacking process, the via-holes 15 are made in necessary positions. Thereafter, to form the wirings 13 in a desired pattern with the stacked copper foils, a Dry Film photoResist (DFR) is applied, and the remaining DFR excluding the regions corresponding to the wiring shapes of the desired pattern is removed through an exposure and development process. Thereafter, the resulting DFR is subject to etching to remove the copper foils in unnecessary regions, thereby completing the wirings 13.

Finally, a conductive paste is poured into the via-holes 15 formed in the base film 11 to conductively connect the wirings 13 formed on both sides of the base film 11.

However, the method of fabricating the conventional printed circuit board has a complicated fabrication process including the process of exposing and developing the DFR and the etching process for removing the copper foils in unnecessary regions, thus increasing the fabrication cost. This fabrication cost then likely increases the cost of the device for the users.

Further, the conductive paste injected into the via-holes should be adhered closely to wall surfaces of the via-holes. Undesirably, however, the injected conductive paste may not be well adhered to the wall surfaces of the via-holes, reducing reliabilities of the products. In particular, when the flexible printed circuit boards are crookedly transformed by the external forces during their wiring or transport process, the conductive pastes, which were hardened without being adhered closely to the wall surfaces of the via-holes, may be cracked, increasing the failure rate.

SUMMARY OF THE INVENTION

The present invention has been designed to address at least the above-mentioned problems and/or disadvantages and to provide at least the advantages described below. Accordingly, an aspect of the present invention is to provide an improved method of fabricating a printed circuit board at a reduced cost by simplifying the fabrication process.

Another aspect of the present invention is to provide a printed circuit board fabrication method that improves the reliabilities of products and reduces the failure rate of the manufactured product by applying a low-viscosity conductive material to wall surfaces of via-holes provided to conductively connect wirings formed on both sides of a base film, and hardening the conductive material.

In accordance with an aspect of the present invention, a method for fabricating a printed circuit board is provided. The method includes manufacturing a base film including a first side and a second side opposite to the first side; printing a first wiring on the first side with a high-viscosity conductive material having a viscosity of 5,000 to 300,000 centipoise (CPS); forming a via-hole that passes through both sides of the base film, and passes by the first wiring; and printing a second wiring on the second side with a low-viscosity conductive material having a viscosity of 100 to 5,000 CPS. In the second printing step, the low-viscosity conductive material having a viscosity of 100 to 5,000 CPS is applied to an inner wall of the via-hole to conductively connect the first wiring to the second wiring.

BRIEF DESCRIPTION OF THE DRAWINGS

The above and other aspects, features, and advantages of certain embodiments of the present invention will be more apparent from the following description taken in conjunction with the accompanying drawings, in which.

Throughout the drawings, the same drawing reference numerals will be understood to refer to the same elements, features and structures.

DETAILED DESCRIPTION OF EMBODIMENTS OF THE INVENTION

The following description in reference to the accompanying drawings is provided to assist in a comprehensive understanding of various embodiments of the present invention as defined by the claims and their equivalents. It includes various specific details to assist in that understanding. Accordingly, those of ordinary skill in the art will recognize that various changes and modifications of the embodiments described herein can be made without departing from the scope and spirit of the present invention. In addition, descriptions of well-known functions and constructions are omitted for clarity and conciseness.

The terms and words used in the following description and claims are not limited to the bibliographical meanings, but are used by the inventor to enable a clear and consistent understanding of the present invention. Accordingly, it should be apparent to those skilled in the art that the following description of embodiments of the present invention is provided for illustration purpose only and not for the purpose of limiting the invention as defined by the appended claims and their equivalents.

It is to be understood that the singular forms "a," "an," and "the" include plural referents unless the context clearly dictates otherwise. Thus, for example, reference to "a component surface" includes reference to one or more of such surfaces.

Figure 4A:
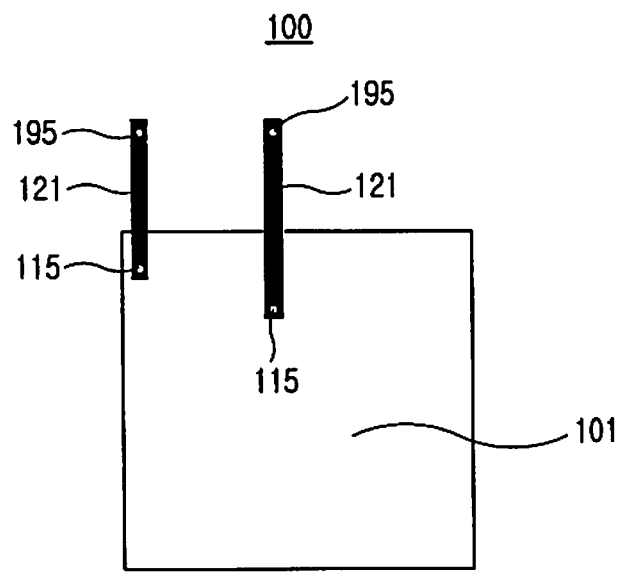
Figure 4B:
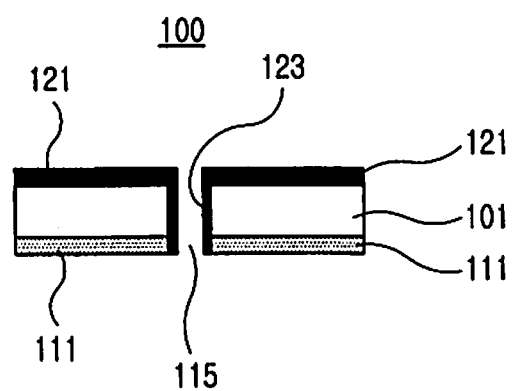
Figure 5A:
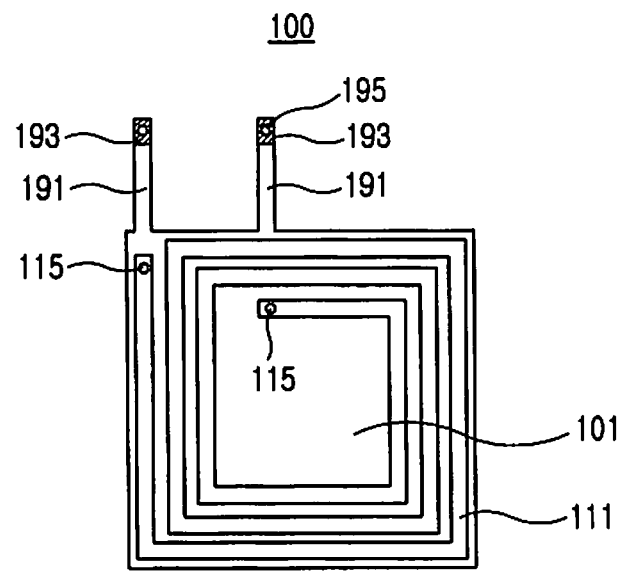
Figure 5B:
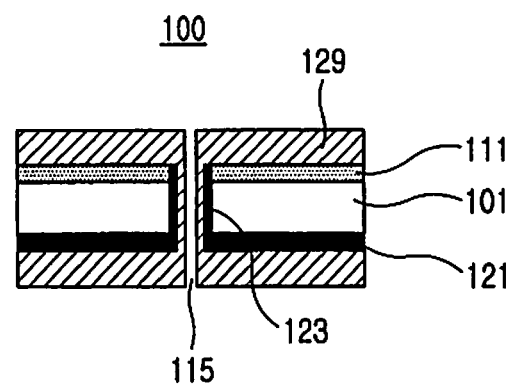

Referring to FIGS. 2A to 5B, a method for fabricating a printed circuit board 100 according to an embodiment of the present invention basically includes a film manufacturing step, a first printing step, a drilling step, and a second printing step. The method may further include a protection coating step and a plating step, if necessary. It is to be understood that the boards 100 illustrated in FIGS. 2A to 4B are incomplete boards, and the boards 100 completed by the proposed fabrication method are illustrated in FIGS. 5A and 5B.

In the film manufacturing step, a base film 101 is manufactured by cutting out a film in accordance with an intended size of a printed circuit board 100. The base film 101 includes a first side, and a second side that is opposite to the first side. Polyimide, which has good thermal resistance and electrical insulating properties, is preferably used as a material of the base film 101. However, a different flexible material such as polyethylene terephthalate (PETP) may also be used to manufacture the base film 101.

Figure 1:
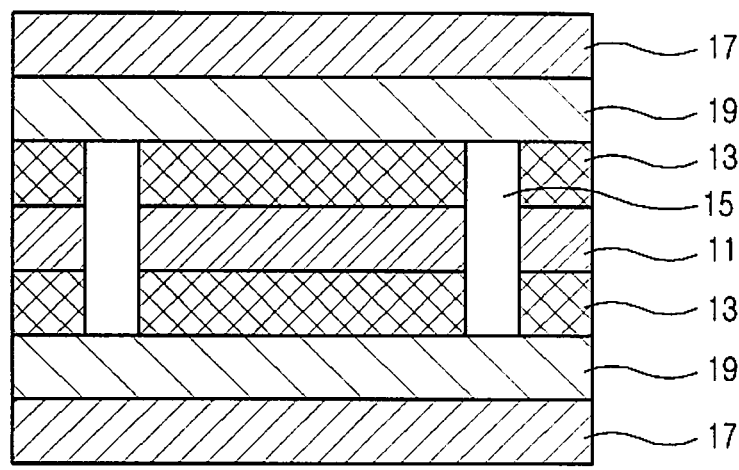
FIG. 1 is a cross-sectional view schematically illustrating a printed circuit board found in the prior art.
Figure 2A:
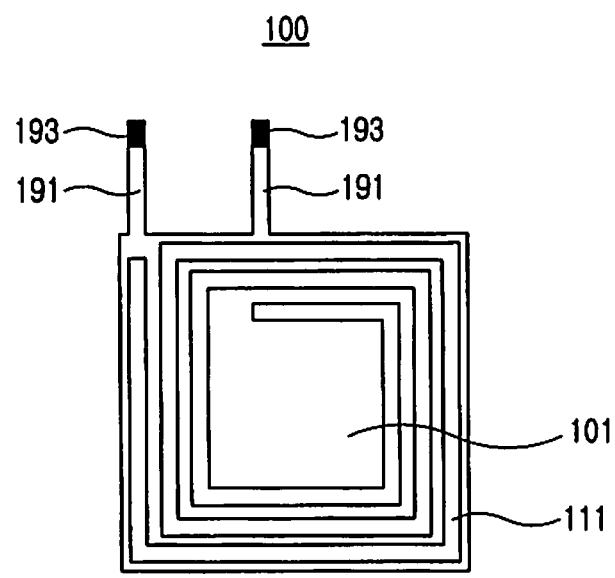
FIGS. 2A to 5B are diagrams illustrating, on a step-by-step basis, a printed circuit board being manufactured according to an embodiment of the present invention.
Figure 2B:
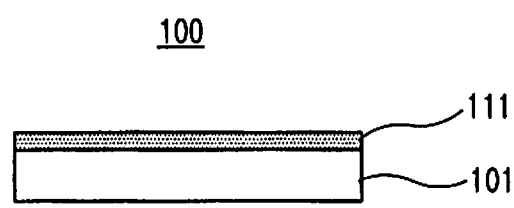

Referring to FIGS. 2A and 2B, the base film 101 includes leads 191 provided on its one side, and connection terminals 193 are formed on the ends of the leads 191. In the following description, although the leads 191 are also a part of the base film 101, they are separated from the base film 101 for convenience of description. The leads 191 are used as connection terminals for connecting the completed printed circuit board 100 to another printed circuit board or the like. The leads 191 cannot serve as connection terminals in themselves, and second wirings 121, which will be described below, can be formed on one of the sides of the leads 191 so that the leads 191 can function as connection terminals.

In the first printing step, a first wiring 111 is printed on the first side of the manufactured base film 101. The first wiring 111 provided in accordance with a printed circuit pattern is directly printed on the first side using a high-viscosity conductive material. The high-viscosity conductive material refers to a conductive printing material that contains one of silver (Ag), copper (Cu), and a silver-nickel alloy (Ag+Ni) as its chief ingredient and has a viscosity of 5,000 to 300,000 centipoise (CPS). After being formed on the first side, the printed circuit pattern is hardened, thereby completing the first wiring 111.

It is also preferable that a high-viscosity conductive material is applied even to the connection terminals 193 of the leads 191.

Figure 3A:
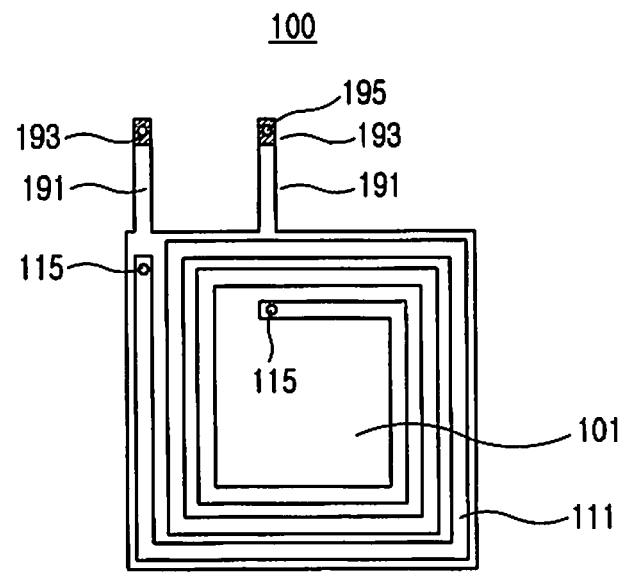
Figure 3B:
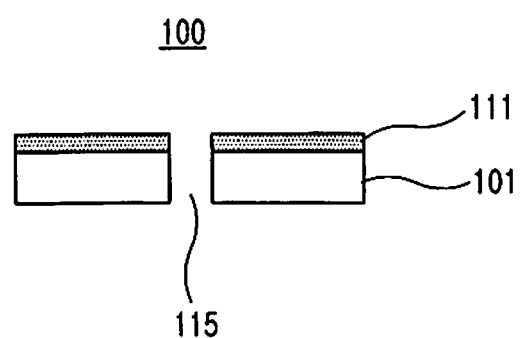

Referring to FIGS. 3A and 3B, in the drilling step, via-holes 115 and 195 are formed to conductively connect the first wiring 111 to the second wirings 121 to be formed on the second side of the base film 101. The via-holes 115 and 195 are subject to change in the number and positions thereof according to the printed circuit board intended to be manufactured. As illustrated in FIGS. 3A and 3B, in the embodiment, the via-holes 115 and 195 are formed on both ends of the first wiring 111 and the connection terminals 193, respectively.

FIG. 4A illustrates a rear side of the base film 101, after the second printing step is completed. In the second printing step, the second wirings 121 are formed on the second side of the base film 101. The second wirings 121, which are provided in accordance with a printed circuit pattern, are directly printed on the second side using a low-viscosity conductive material. The low-viscosity conductive material indicates a conductive printing material having a viscosity of 100 to 5,000 CPS. After being formed on the second side, the printed circuit pattern is hardened, thereby completing the second wirings 121.

The second wirings 121 are printed in the form of connecting the adjacent via-hole 115 and 195 to each other. That is, through the second wirings 121, the via-hole 115 situated in one end of the first wiring 111 is connected to one of the via-holes 195 formed on the connection terminals 193, and the via-hole 115 located in the other end of the first wiring 111 is connected to the other one of the via-holes 195 formed on the connection terminals 193.

When discharging a low-viscosity conductive material to form the second wirings 121, the low-viscosity conductive material is applied along inner walls of the via-holes 115 and 195, as indicated by reference numeral 123. That is, a conduction structure between the first wiring 111 and the second wirings 121 is formed the instant that the low-viscosity conductive material provided for forming the second wirings 121 is applied.

Consequently, there is no need to separately pour conductive pastes into the via-holes 115 and 195 in order to conductively connect the first and second wirings 111 and 121 to each other, making it possible to eliminate the concern of the reliability reduction which may occur as the conduction structures (hardened conductive pastes) formed in the via-holes are not adhered closely to the inner walls of the via-holes.

In this structure, as the second wirings 121 are formed, the first wiring 111 can be connected to another printed circuit board or the like. That is, when the first wiring 111 in a spiral form is formed only on the first side as illustrated in FIGS. 2A and 2B or FIGS. 3A and 3B, another wiring should be formed in an in-between space of the first wiring 111 in order to provide a connection terminal to an end of the first wiring 111 situated in the inner side. However, this makes the printed circuit pattern formed on the first side complicated, and reduces integration of the printed circuit pattern. On the other hand, as the second wirings 121 are formed and the first and second wirings 111 and 121 are conductively connected to each other through the via-holes 115 and 195, the first wiring 111 can be simplified, contributing to improvement of the integration of the printed circuit board 100.

FIGS. 5A and 5B illustrate a completed printed circuit board 100, after a protection coating step or plating step is finished. In the protection coating step or plating step, a structure is formed that prevents the first and second wirings 111 and 121 from being oxidized or damaged by the physical contacts. A protection coating layer (not shown) can be formed by adhering a polyimide or a polyethylene terephthalate, which is the same material as that of the base film 101, to both sides of the base film 101. Meanwhile, it is preferable that the first and second wirings 111 and 121, especially the connection terminals 193 are subjected to plating. That is, soldering can be used to connect the printed circuit board 100 to another printed circuit board. If the first and second wirings 111 and 121 associated with the connection terminals 193 are made of copper, the soldering is not easily performed due to the low affinities with the solder. Therefore, it is preferable to form a plating layer 129 on the connection terminals 193 with a tin-lead alloy or gold, thereby stabilizing the connection structure between the printed circuit board 100 and another printed circuit board.

In addition, when the first and second wirings 111 and 121 are made of copper, they are apt to be oxidized through contact with the air. However, the first and second wirings 111 and 121 can be prevented from being oxidized by forming the plating layer 129.

As is apparent from the foregoing description, because the proposed printed circuit board fabrication method directly prints wirings on one side of a base film with a high-viscosity conductive material, the method does not need the process of exposing and developing a DFR or the process of etching copper foils. Therefore, the fabrication process of printed circuit board according to an embodiment of the present invention is simplified, thereby reducing the fabrication cost and in turn the purchase prices for the end users.

Further, when wirings are formed on both sides of the base film and conductively connected to each other through via-holes, the wirings are printed on the second side using a low-viscosity conductive material. The low-viscosity conductive material can be printed along the surface of the base film, and further along the wall surfaces of the via-holes. Therefore, the instant that the wirings formed on the second side of the base film, they are conductively connected to the wiring formed on the first side. As a result, there is no need to separately inject a conductive material into the via-holes. Instead, the low-viscosity conductive material is printed in itself along the wall surfaces of the via-hole, thereby conductively connecting the wirings formed on the first and second sides and thus contributing to improvement of reliability and failure rate.

While the present invention has been shown and described with reference to certain embodiments thereof, it will be understood by those skilled in the art that various changes in form and details may be made therein without departing from the spirit and scope of the present invention as defined by the appended claims and their equivalents.

What is claimed is:

1. A method for fabricating a printed circuit board, the method comprising:
    manufacturing a base film including a first side and a second side, the second side being opposite to the first side;
    printing a first wiring on the first side of the base film with a high-viscosity conductive material having a viscosity of 5,000 to 300,000 centipoise (CPS); then
    forming a via-hole that passes through both the first and second sides of the base film, and passes by the first wiring; and
    printing a second wiring on the second side of the base film with a low-viscosity conductive material having a viscosity of 100 to 5,000 CPS, wherein the low-viscosity conductive material is applied to an inner wall of the via-hole to conductively connect the first wiring to the second wiring.

2. The method of claim 1, the base film is manufactured with at least one of a polyimide and a polyethylene terephthalate.

3. The method of claim 1, further comprising coating a protection layer on both the first and second sides of the base film, after printing the second wiring.

4. The method of claim 1, further comprising forming a plating layer on the first and second wirings, after printing the second wiring.

5. The method of claim 4, wherein the plating layer is formed on both the first and second wirings.

6. The method of claim 4, wherein the plating layer is formed on a connection terminal of the printed circuit board.

7. The method of claim 1, wherein the conductive material used for printing the first and second wirings includes at least one of silver (Ag), copper (Cu), and a silver-nickel alloy (Ag+Ni).

* * * * *